United States Patent [19]
Ando

[11] Patent Number: 5,492,854
[45] Date of Patent: Feb. 20, 1996

[54] METHOD OF MANUFACTURING SEMICONDUCTOR DEVICE

[75] Inventor: Koichi Ando, Tokyo, Japan

[73] Assignee: NEC Corporation, Tokyo, Japan

[21] Appl. No.: 358,624

[22] Filed: Dec. 14, 1994

[30] Foreign Application Priority Data

Dec. 17, 1993 [JP] Japan ................................ 5-318621

[51] Int. Cl.$^6$ .................................................. H01L 21/70
[52] U.S. Cl. .................. 437/60; 437/47; 437/52; 437/919; 148/DIG. 14; 148/DIG. 17; 148/DIG. 112
[58] Field of Search ........................... 437/241, 242, 437/47, 48, 52, 60, 919, 235, 247; 148/DIG. 17, DIG. 14, DIG. 112

[56] References Cited

U.S. PATENT DOCUMENTS

| | | | |
|---|---|---|---|
| 4,277,320 | 7/1981 | Beguwala et al. | 437/242 |
| 4,855,258 | 8/1989 | Allman et al. | 437/241 |
| 5,032,545 | 7/1991 | Doan et al. | 437/235 |
| 5,089,441 | 2/1992 | Moslehi | 437/247 |
| 5,104,694 | 4/1992 | Saito et al. | 427/255 |
| 5,362,632 | 11/1994 | Matthews | 437/47 |
| 5,387,545 | 2/1995 | Kiyota et al. | 437/165 |

FOREIGN PATENT DOCUMENTS

| | | | |
|---|---|---|---|
| 0005491 | 11/1979 | European Pat. Off. | 437/241 |
| 0539233 | 4/1993 | European Pat. Off. | 437/919 |
| 0125635 | 9/1980 | Japan | 437/241 |
| 2-150029 | 6/1990 | Japan . | |
| 3-270236 | 12/1991 | Japan . | |
| 0348524 | 12/1992 | Japan | 437/241 |
| 0109981 | 4/1993 | Japan | 437/919 |

*Primary Examiner*—Tuan H. Nguyen
*Attorney, Agent, or Firm*—Young & Thompson

[57] ABSTRACT

A method of manufacturing a semiconductor device includes the step of forming a capacitor. The step includes the step of forming a lower electrode constituted by a polysilicon film which selectively covers a surface of a predetermined insulating film on a semiconductor substrate, and the step of performing heating in an atmosphere containing an $SiH_4$ gas and removal of a native oxide film on a surface of the lower electrode, and then performing formation of a silicon nitride film without being exposed to an oxygen atmosphere.

10 Claims, 2 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of manufacturing a semiconductor device having a capacitor, such as a DRAM.

2. Description of the Prior Art

A capacitor insulating film of a DRAM has a two-layered structure constituted by a silicon oxide film and a silicon nitride film. This capacitor insulating film is obtained as follows. A silicon nitride film is grown on a polysilicon film as a lower electrode by a low-pressure chemical vapor deposition method, and then a silicon oxide film is formed on the surface of the silicon nitride film by wet oxidation.

As shown in FIG. 1, however, a native oxide film 8 is present on the interface of a silicon nitride film 9 and a polysilicon film serving as a lower electrode 7. The presence of this native oxide film decreases the capacitance, and increases the current leakage from a capacitor insulating film, resulting in degradation of dielectric breakdown characteristics. For this reason, in order to completely remove the native oxide film on the interface, the native oxide film is removed, and the silicon nitride film is immediately formed on the polysilicon film in, e.g., the same reaction furnace without exposing the surface of the polysilicon film to an oxygen atmosphere. This is effective in decrease current leakage and improving dielectric breakdown resistance.

As a conventional technique of removing a native oxide film on silicon, a method of performing heating in a $H_2$ atmosphere, and reducing a native oxide film with hydrogen to remove the film, and a method of performing heating in a reactive gas (e.g., 1% HCl–99% $H_2$), and etching a native oxide film together with the surface of a substrate to remove the film are considered as preprocessing before forming a gate oxide film, unlike preprocessing before forming a capacitor insulating film (both the methods are disclosed in Japanese Unexamined Patent Publication No. 2-150029). Of the two methods, the method of performing heating in the $H_2$ gas atmosphere, and reducing a native oxide film with hydrogen to remove the film will be described below.

According to this method, a silicon substrate is prepared as a substrate, and the silicon substrate is cleaned before oxidation using normal chemicals, distilled water, and the like. In order to prevent the growth of a native oxide film, the silicon substrate is set in a reaction furnace in a $N_2$ atmosphere. After the reaction furnace is evacuated into a high vacuum, $H_2$ is introduced into the reaction furnace. While introducing $H_2$, a reduced pressure state at a low vacuum of 1.3 to $1.3 \times 10^4$ Pa is kept, and heating of the silicon substrate is controlled to keep the silicon substrate at a surface temperature of 1,000° C. for about 10 to 30 seconds. The heating of the silicon substrate is stopped, and the supply of $H_2$ is also stopped. After the silicon substrate is cooled to room temperature, the reaction furnace is evacuated to a high vacuum. In order to form a silicon oxide film on the silicon substrate, $O_2$ is introduced into the reaction furnace. Heating of the substrate is adjusted to keep the substrate at a temperature of about 1,100° C. for about 20 seconds. The heating of the silicon substrate is stopped, and the supply of $O_2$ is also stopped. Then, the substrate is cooled to room temperature. According to the above method, the silicon oxide film is formed on the surface of the silicon substrate after removing the native oxide film.

As preprocessing for growing a GaAs layer on a silicon substrate, a technique of removing a native oxide film by which heating is performed in a $GeH_4$ atmosphere is known (Japanese Unexamined Patent Publication No. 3-270236).

According to this method, a silicon substrate is set in an organic metal chemical vapor deposition furnace. $GeH_4$ is introduced into the reaction furnace at $1 \times 10^4$ Pa, and the silicon substrate is heated to 200° to 400° C. to anneal. By this processing, a native oxide film on the silicon substrate is removed to make a clean silicon surface appear. Next, trimethylgallium and $AsH_3$ are introduced into the reaction furnace, and a GaAs layer is grown on the silicon substrate under conditions at a growth temperature of 700° C., and a pressure of $1 \times 10^4$ Pa.

When the above technique of removing a native oxide film is used before formation of a silicon nitride film for a capacitor insulating film, the following problems ensue.

(1) According to the method of removing a native oxide film by heating in a hydric atmosphere, a heating temperature of about 1,000° C. is required. Such a temperature has no problem as preprocessing before formation of a gate oxide film, as a stage before forming a source/drain region of a MOS transistor. However, when the method of removing a native oxide film by heating in a hydric atmosphere in the $H_2$ atmosphere is applied to preprocessing before formation of a capacitor insulating film of a stacked capacitor where a MOS transistor has been formed, heating at about 1,000° C. causes an increase in width of the source/drain diffusion layer, and this makes it impossible to form a fine element.

(2) According to the method of removing a native oxide film by heating in a reactive gas (e.g., 1% HCl–99% $H_2$) atmosphere, since silicon is undesirably etched at the same time of removing a native oxide film, the surface of a low electrode is roughened to increase the current leakage from a capacitor.

(3) According to the method of removing a native oxide film by heating in a $GeH_4$ atmosphere, a native oxide film can be removed at a relative low heating temperature of about 200° to 400° C. $GeH_4$ used in this method, however, easily self-decomposes by external factors such as vibrations, and its pressure increases to about 20 times, resulting in difficult handling in terms of safety. When this method of removing an oxide film is applied to preprocessing before formation of a capacitor insulating film, the step of completely substituting an atmosphere is required between the step of removing the native oxide film using $GeH_4$ and a step of forming a silicon nitride film.

SUMMARY OF THE INVENTION

The present invention has been made in consideration of the above problems in the conventional techniques, and has as its object to provide a method of continuously performing removal of a native oxide film and the growth of a silicon nitride film using a gas which is easy to handle in terms of safety by low-temperature heating which does not adversely affect a MOS transistor formed in a lower layer of a stacked capacitor without roughening the surface of a polysilicon film as a lower electrode.

In order to achieve the above object, according to the main aspect of the present invention, there is provided a method of manufacturing a semiconductor device comprising the step of forming a capacitor including the step of forming a lower electrode constituted by a polysilicon film which selectively covers a surface of a predetermined insulating film on a semiconductor substrate, and the step of performing heating in a atmosphere containing an $SiH_4$ gas and removal of a native oxide film on a surface of the lower electrode, and then performing formation of a silicon nitride film without being exposed to an oxygen atmosphere.

According to the second aspect of the present invention, there is provided a method of manufacturing a semiconductor device, described in the main aspect, wherein the removal of the native oxide film and the formation of the silicon nitride film are sequentially performed in the same reaction furnace.

According to the third aspect of the present invention, there is provided a method of manufacturing a semiconductor device, described in the main or second aspect, wherein the formation of the silicon nitride film is performed using a gas mixture of the $SiH_4$ gas and an $NH_3$ gas.

Further, the removal of the native oxide film described in the main or second aspect is performed in an atmosphere containing the $SiH_4$ gas and $H_2$ gas.

According to the method of manufacturing a semiconductor device of the present invention, the native oxide film on the surface of the lower electrode is removed by heating in the atmosphere containing the $SiH_4$ gas. With this operation, the capacitor insulating film is sequentially performed in the same reaction furnace without adversely affecting an underlying diffusion layer, making the surface of the lower electrode uneven, and raising a problem in terms of safety. Therefore, an extremely thin capacitor insulating film with little current leakage can be realized to obtain a semiconductor device having a capacitor with further improved reliability.

The above and other advantages, features and additional objects of the present invention will become manifest to those versed in the art upon making reference to the following detailed description and accompanying drawings in which preferred embodiments incorporating the principle of the present invention are shown by way of an illustrative example.

DETAILED DESCRIPTION OF THE PREFERRED EMBODIMENT

The present invention will be described in detail with reference to an embodiment of the present invention shown in the accompanying drawings (FIGS. 2A to 2E).

Figure 1:
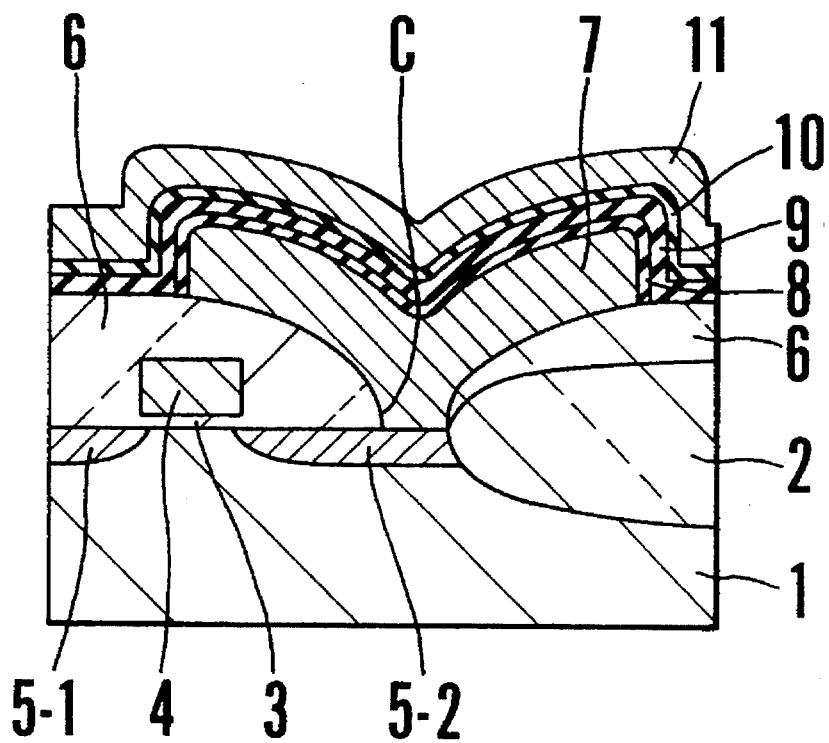
FIG. 1 is a sectional view showing a memory cell of a conventional stacked capacitor DRAM.
Figure 2A:
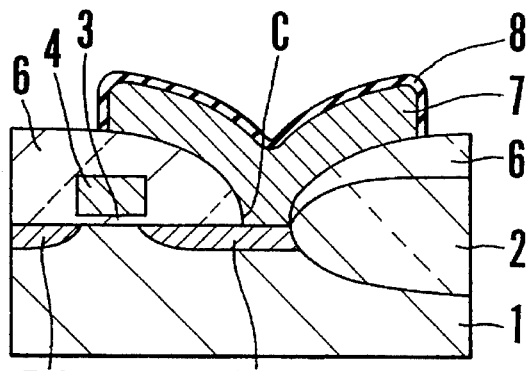
FIGS. 2A to 2E are sectional views showing the manufacturing steps so as to represent an embodiment of the present invention.

As shown in FIG. 2A, a gate oxide film 3 is formed in an element formation region isolated by selectively forming a field oxide film 2 on the surface of a p-type silicon substrate 1. A gate electrode 4 is formed on the gate oxide film 3, n-type source/drain diffusion layers 5-1 and 5-2 are formed in the resultant structure, and then an insulating interlayer 6 is deposited. A contact hole C is formed in the source/drain diffusion layer 5-2, a polysilicon film is deposited to a thickness of several hundreds nm on the resultant structure by a low-pressure chemical vapor deposition method, and an impurity such as phosphorus is doped in the polysilicon film by a diffusion method. The polysilicon film is patterned by a normal photoresist process, and a dry etching process to have a desired shape, thereby forming a lower electrode 7. The resultant structure is cleaned. In the cleaning process, the resultant structure is generally cleaned in a solution mixture of ammonium hydroxide, hydrogen peroxide, and water, and a solution mixture of hydrochloric acid, hydrogen peroxide, and water sequentially or independently. Upon this cleaning, a native oxide film 8 having a thickness of 1 to 2 nm is formed on the surface of the lower electrode 7.

Next, the resultant substrate is set in a reaction furnace. At this time, as a reaction furnace, a resistance heating electric furnace with a load-lock chamber having the function of avoiding formation of a native oxide film, or a cold wall lamp heating RTP (Rapid Thermal Processing) device is used. The substrate is desirably set in the reaction furnace in an inert gas atmosphere such as nitrogen or a high vacuum.

Figure 2B:
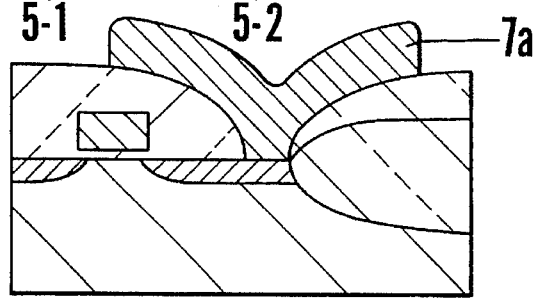

A $SiH_4$ gas is supplied into the reaction furnace at the rate of 1 ml per minute, and the substrate is heated to 800° C. or less, e.g., 750° C., at a pressure of 0.13 Pa or less to remove the native oxide film 8, as shown in FIG. 2B.

Figure 2C:
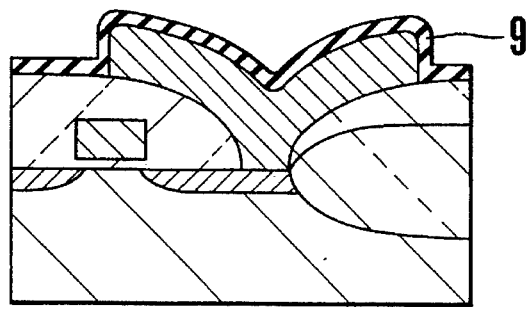

The heating of the substrate is stopped, and the supply of the $SiH_4$ gas is also stopped. The substrate is cooled to room temperature. After the interior of the reaction furnace is substituted with an inert gas atmosphere such as nitrogen or evacuated to a high vacuum, $NH_3$ gas is introduced into the reaction furnace at the rate of, e.g., 1 l per minute, and the rate of $SiH_4$ gas is increased by 20 ml per minute so as to form a silicon nitride film. The silicon substrate 1 is heated to, e.g., 700° to 800° C. at a pressure of about 133 Pa to 1,330 Pa, thereby forming a silicon nitride film 9 having a thickness of, e.g., about 5 to 10 nm by the low-pressure chemical vapor deposition method, as shown in FIG. 2C.

Figure 2D:
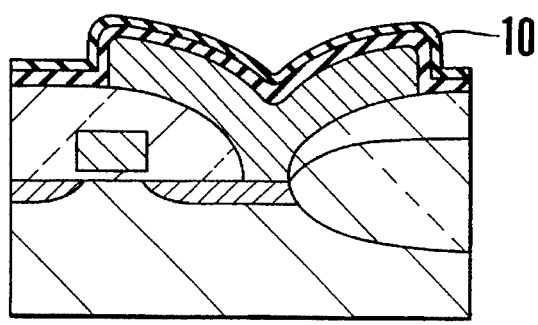
Figure 2E:
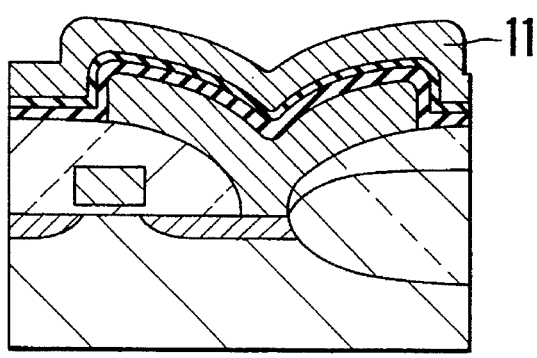

As shown in FIG. 2D, a silicon oxide film 10 is formed on the surface of the silicon nitride film 9 by a general wet oxidation method. Thereafter, a polysilicon film is formed to have a thickness of several hundreds nm by the low-pressure chemical vapor deposition method so as to form an upper electrode 11, as shown in FIG. 2E.

In this manner, the native oxide film can be completely removed from the interface between the silicon nitride film 9 and a lower electrode 7a. At this time, the surface of the lower electrode 7a is not roughened. This structure realizes a decrease in current leakage from the very thin capacitor insulating film having a thickness of about 5 nm which is figured out as the thickness of an oxide film, and an improvement in dielectric breakdown resistance. Since a processing temperature can be set at 800° C. or less, a highly integrated DRAM using a finer MOS transistor, which has the diffusion layer with a thickness of 0.08 µm or less, as a cell gate can be formed. In addition, a dangerous gas such as $GeH_4$ need not be used.

In the above description, after the step of removing the native oxide film, the heating of the substrate and the supply of the $SiH_4$ gas are stopped, the atmosphere in the reaction furnace is substituted, and the reaction furnace is evacuated to a high vacuum before the formation of the silicon nitride film. In contrast to this, after the removal of the native oxide film 8, while the heating of the substrate and the supply of the $SiH_4$ gas are continued, the $NH_3$ gas is added at the rate of, e.g., 1 l per minute, the $SiH_4$ gas is increased by, e.g., 20 ml per minute, and the substrate is heated to, e.g., 700° to 800° C. at a pressure of about 133 Pa, thereby forming the silicon nitride film 9 having a thickness of, e.g., 5 to 10 nm by the low-pressure chemical vapor deposition method.

In this case, since the time for cooling the substrate, the time for substituting the atmosphere in the reaction furnace with the inert gas, and the time for evacuating the reaction furnace to a high vacuum are not required, the manufacturing throughput can be improved.

In the step of removing the native oxide film, an $H_2$ gas can be supplied into the reaction furnace at the rate of, e.g., 10 l per minute in addition to the $SiH_4$ gas at the rate of, e.g., 1 ml per minute. With this operation, the pressure can be equal to the pressure (about 133 to 1,330 Pa) of the low-pressure chemical vapor deposition step of the silicon nitride film as the subsequent step, and the structure of an exhaust system of the device can be simplified.

Further, according to the above embodiment, the silicon oxide film 10 is formed by the wet oxidation method after the growth of the silicon nitride film 9. However, the polysilicon film may be formed to have a thickness of several hundreds nm by the low-pressure chemical vapor deposition method so as to form the upper electrode without forming the silicon oxide film 10.

What is claimed is:

1. A method of manufacturing a semiconductor device, which comprises the steps of: forming a capacitor including forming a lower electrode constituted by a polysilicon film which selectively covers a surface of an insulating film on a semiconductor silicon substrate, heating in an atmosphere containing a $SiH_4$ gas and removing a native oxide film on a surface of the lower electrode, and then forming a silicon nitride film without exposure to an oxygen atmosphere.

2. A method according to claim 1, wherein the steps of removing the native oxide film and of forming the silicon nitride film are sequentially performed in the same reaction furnace.

3. A method according to claim 2, wherein the silicon nitride film is formed using a gas mixture of the $SiH_4$ gas and an $NH_3$ gas.

4. A method according to claim 3, wherein the step of forming the silicon nitride film is performed under conditions that the $NH_3$ gas is supplied at 1 l per minute, the $SiH_4$ gas is supplied at 20 ml per minute, and the silicon substrate is heated to a temperature of 700° to 800° C. at a pressure of 133 Pa to 1,330 Pa.

5. A method according to claim 2, wherein the step of removing the native oxide film is performed in an atmosphere containing the $SiH_4$ gas and an $H_2$ gas.

6. A method according to claim 5, wherein the $H_2$ gas is supplied at 10 l per minute and a pressure of 133 Pa to 1,330 Pa.

7. A method according to claim 1, wherein the silicon nitride film is formed using a gas mixture of the $SiH_4$ gas and an $NH_3$ gas.

8. A method according to claim 1, wherein the step of removing the native oxide film is performed in an atmosphere containing the $SiH_4$ gas and an $H_2$ gas.

9. A method according to claim 8, wherein the $H_2$ gas is supplied at 10 l per minute and a pressure of 133 Pa to 1,330 Pa.

10. A method according to claim 1, wherein the step of removing the native oxide film is performed under conditions that the $SiH_4$ gas is supplied at 1 ml per minute, and the silicon substrate is heated to a temperature of not more than 800° C. at a pressure of not more than 0.13 Pa.

* * * * *